United States Patent [19]

Uetani et al.

[11] Patent Number: 5,378,586
[45] Date of Patent: Jan. 3, 1995

[54] RESIST COMPOSITION COMPRISING A QUINONE DIAZIDE SULFONIC DIESTER AND A QUINONE DIAZIDE SULFONIC COMPLETE ESTER

[75] Inventors: Yasunori Uetani, Minoo; Makoto Hanabata, Hyogo; Hirotoshi Nakanishi, Osaka; Koji Kuwana, Fujiidera; Fumio Oi, Ashiya, all of Japan

[73] Assignee: Sumitomo Chemical Company, Limited, Osaka, Japan

[21] Appl. No.: 152,891

[22] Filed: Nov. 16, 1993

Related U.S. Application Data

[63] Continuation of Ser. No. 419,831, Oct. 11, 1989, abandoned.

[30] Foreign Application Priority Data

Oct. 13, 1988 [JP] Japan .................. 63-258937

[51] Int. Cl.$^6$ .................. G03F 7/023; G03F 7/30
[52] U.S. Cl. .................. 430/192; 430/165; 430/191; 430/193
[58] Field of Search .................. 430/191, 192, 193, 165

[56] References Cited

U.S. PATENT DOCUMENTS

| | | | |
|---|---|---|---|
| 2,767,092 | 10/1956 | Schmidt | 430/193 |
| 3,106,465 | 10/1963 | Neugebauer et al. | 430/193 |
| 3,188,210 | 6/1965 | Fritz et al. | 430/193 |
| 4,059,449 | 11/1977 | Rosenkranz et al. | 430/192 |
| 4,424,270 | 1/1984 | Erdmann et al. | 430/193 |
| 4,439,516 | 3/1984 | Cernigliaro et al. | 430/192 |
| 4,499,171 | 2/1985 | Hosaka et al. | 430/192 |
| 4,588,670 | 5/1986 | Kelly et al. | 430/192 |
| 4,719,167 | 1/1988 | Miura et al. | 430/192 |
| 4,837,121 | 6/1989 | Blakeney et al. | 430/192 |
| 4,863,823 | 9/1989 | Kawabe et al. | 430/192 |
| 4,894,311 | 1/1990 | Uenishi et al. | 430/193 |
| 4,943,511 | 7/1990 | Lazarus et al. | 430/192 |
| 4,959,292 | 9/1990 | Blakeney et al. | 430/165 |
| 4,985,333 | 1/1991 | Tokutake et al. | 430/193 |
| 5,059,507 | 10/1991 | Uetani et al. | 430/192 |
| 5,124,228 | 6/1992 | Uetani et al. | 430/193 |

FOREIGN PATENT DOCUMENTS

| | | |
|---|---|---|
| 58-150948 | 9/1983 | Japan . |
| 60-121445 | 6/1985 | Japan . |
| 63-110446 | 5/1988 | Japan . |

Primary Examiner—Charles L. Bowers, Jr.
Assistant Examiner—John S. Chu
Attorney, Agent, or Firm—Birch, Stewart, Kolasch & Birch

[57] ABSTRACT

A positive resist composition which comprises in admixture an alkali-soluble resin and, as a sensitizer, first and second quinone diazide sulfonic acid esters of a phenol compound, wherein (a) the first ester is a quinone diazide sulfonic acid diester of a phenol compound having not less than three hydroxyl groups which exhibits a pattern area that is not less than 40% of all pattern areas corresponding to the sensitizer in a high pressure liquid chromatography (HPLC) pattern measured with a primary detector using UV light having a wavelength of 254 nm, and (b) the second ester is a quinone diazide sulfonic acid ester that is a complete ester of a phenol compound having not less than two hydroxyl groups which exhibits a pattern area corresponding to not less than 5% and is less than 60% of all pattern areas corresponding to the sensitizer in the HPLC pattern.

14 Claims, No Drawings

RESIST COMPOSITION COMPRISING A QUINONE DIAZIDE SULFONIC DIESTER AND A QUINONE DIAZIDE SULFONIC COMPLETE ESTER

This application is a continuation, of application Ser. No. 07/419,831 filed on Oct. 11, 1989, now abandoned.

BACKGROUND OF THE INVENTION

1. Field of the Invention

The present invention relates to a resist composition which has high γ-value and high film thickness retention.

2. Description of the Related Art

A composition containing a compound having a quinone diazide group such as a naphthoquinone diazide group, a benzoquinone diazide group, etc. and an alkali-soluble resin finds use as a positive resist, because upon exposure to ultraviolet rays, the quinone diazide group decomposes to form a carboxyl group whereby the originally alkali-insoluble composition becomes alkali-soluble. A condensation product of a phenol compound (e.g. trihydroxybenzophenone, tetrahydroxybenzophenone and so on) with a quinone diazide compound is used as a sensitizer.

However, particularly with integrated circuits, miniaturization has proceeded with a rise in the integration level, which results in demands for formation of patterns of submicron order and more excellent resolution (high γ-value). As a result, the conventional compositions cannot improve the γ-value to the desired level.

For example, if the amount of quinone diazide group is increased to improve the γ-value, serious problems such as deterioration of sensitivity and increase of residues after developing arise.

Therefore, the improvement of the γ-value is limited.

To achieve better resolution, high film thickness retention as well as the high γ-value is desired.

SUMMARY OF THE INVENTION

One object of the present invention is to provide a positive resist composition which has a high γ-value and high film thickness retention.

Another object of the present invention is to provide a sensitizer which comprises a quinone diazide sulfonic acid ester of a phenol compound which is used in a positive resist composition.

The present invention is based on the finding that, when a sensitizer comprises largely a diester of a phenol compound having not less than three hydroxyl groups with quinone diazide sulfonic acid and a complete ester of a phenol compound having not less than two hydroxyl groups with quinone diazide sulfonic acids, the positive resist composition comprising such a sensitizer has high γ-value and good film thickness retention.

Accordingly, the present invention provides a positive resist composition which comprises an alkali-soluble resin and, as a sensitizer, a quinone diazide sulfonic acid ester of a phenol compound, wherein (a) a pattern area corresponding to the quinone diazide sulfonic acid diester of the phenol compound having not less than three hydroxyl groups is not less than 40% of all pattern areas corresponding to the sensitizer in a high pressure liquid chromatography (HPLC) pattern measured with a primary detector using UV light having the wavelength of 254 nm, and (b) a pattern area corresponding to the complete ester of the phenol compound having not less than two hydroxyl groups with the quinone diazide sulfonic acid is not less than 5% and less than 60% of all pattern areas corresponding to the sensitizer in the HPLC pattern.

DETAILED DESCRIPTION OF THE INVENTION

In the present invention, the HPLC measurement is carried out under such condition that peaks for two or more components do not overlap each other. If peaks overlap each other, analysis conditions such as a composition of mobile phase should be optimized. In any event, the wavelength of 254 nm of the primary detector should not be changed.

The pattern area corresponding to the diester is preferably not less than 50%. That is, preferably, the pattern area corresponding to the complete ester is less than 50%.

The quinone diazide sulfonic acid ester of the phenol compound may be prepared by a per se conventional method. For example, the ester is prepared by a condensation reaction of the phenol compound with naphthoquinone diazide sulfonyl halogenide or benzoquinone diazide sulfonyl halogenide in the presence of a weak alkali such as sodium carbonate.

There are various processes of preparing the quinone diazide sulfonic acid diester.

For example, the diester component is preferentially prepared when the following phenol compounds are used as the phenol compounds having not less than three hydroxyl groups:

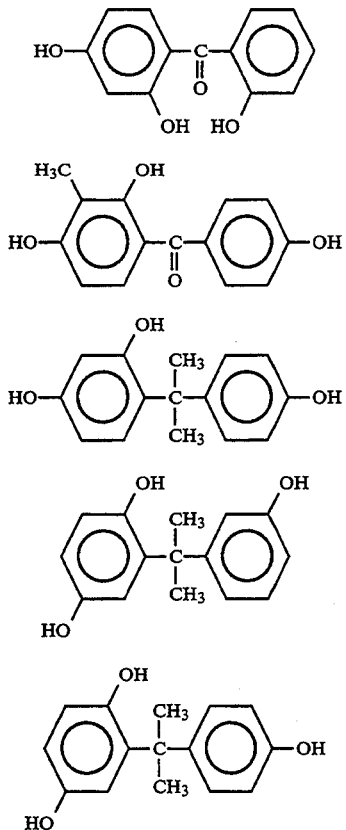

-continued

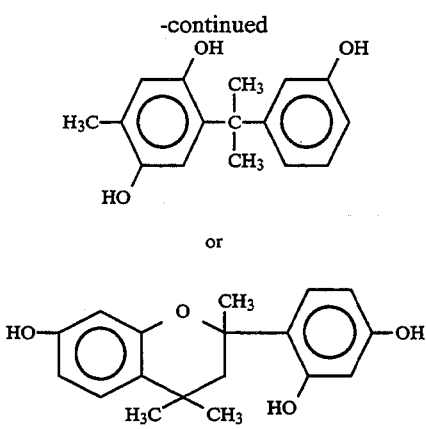

or

In other process, chloroform is used as a solvent in a condensation reaction of quinone diazide sulfonyl halogenide with the phenol compound to preferentially obtain the quinone diazide sulfonic acid diester. Examples of other solvents which have same effect as chloroform are trichloroethane, trichloroethylene, dichloroethane and so on.

The positive resist composition of the present invention may contain two or more quinone diazide sulfonic acid esters of the phenol compound in combination. In this case, when the pattern area corresponding to the complete ester of the phenol compound having not less than two hydroxyl groups with quinone diazide sulfonic acid is less than 5% of all the pattern areas, an ester which comprises the complete ester in a larger amount should be added.

The ester which comprises the complete ester in a larger amount is prepared by reacting at least "m—1" equivalent of the quinone diazide compound with "m" equivalent of the hydroxyl groups of the phenol compound.

A typical example of the di- or polyhydric phenol compound is represented by the general formula (I):

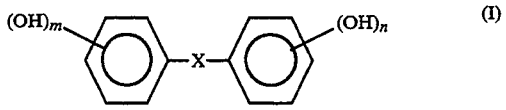

wherein X is a group of the formula:

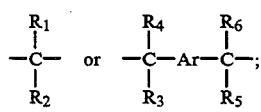

in which $R_1$, $R_2$, $R_3$, $R_4$, $R_5$ and $R_6$ are the same or different and each a hydrogen atom, an alkyl group, an aryl group, an alkenyl group or cyclohexyl group and Ar is a divalent aromatic group; m and n are the same or different and each zero or positive number, provided that the sum of m and n is not less than 2.

Examples of the other di- or polyhydric phenol compounds are hydroquinone, resorcinol, phloroglucin, 2,4-dihydroxyphenone, 2,3,4-trihydroxybenzophenone, tetrahydroxybenzophenones such as 2,3,3',4-tetrahydroxybenzophenone, 2,3,4,4'-tetrahydroxybenzophenone and 2,2',4,4'-tetrahydroxybenzophenone, pentahydroxybenzophenones such as 2,3,3',4,4'-pentahydroxybenzophenone and 2,3,3',4,5'-pentahydroxybenzophenone, alkyl gallates, oxyflavans, etc.

A novolak resin is preferably used as the alkali-soluble resin. The novolak resin is prepared by an addition condensation reaction of a phenol with formaldehyde. Specific examples of the phenol used as one of the raw materials for the novolak resin include phenol, cresol, xylenol, ethylphenol, trimethylphenol, propylphenol, butylphenol, dihydroxybenzene, naphthols, etc. These phenols may be used alone or in combination.

The formaldehyde which undergoes the addition condensation reaction with the phenol can be used in the form of an aqueous solution of formaldehyde (formalin) or paraformaldehyde which is an oligomer of formaldehyde. Particularly, 37% formalin which is commercially mass produced is suitably used.

The addition condensation reaction of the phenol with formaldehyde can be carried out according to the usual method. This reaction is carried out at a temperature of from 60° to 120° C. for 2 to 30 hours. Organic acids, inorganic acids or divalent metal salts are used as catalysts. Specifically, exemplified are oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in the presence or absence of a solvent.

The amount of the quinone diazide sulfonic acid ester to be added to the resist composition is from 10 to 50% by weight based on the total weight of the solid components in the resist composition.

The positive photoresist is prepared by mixing and dissolving the foregoing quinone diazide ester and the novolak resin in a solvent. Preferably, the used solvent evaporates at a suitable drying rate to give a uniform and smooth coating film. Such the solvent includes ethylcellosolve acetate, methylcellosolve acetate, ethylcellosolve, methylcellosolve, propylene glycol, monomethyl ether acetate, butyl acetate, methyl isobutyl ketone, xylene, etc. To the positive photoresist composition obtained by the foregoing method, small amounts of resins, dyes, etc. may be added if desired.

With the resist composition of the present invention, the γ-value and film thickness retension can be improved and the problems associated with increase of developing remains can be solved.

PREFERRED EMBODIMENTS OF THE INVENTION

The present invention will be illustrated more in detail with the following Examples, but it is not limited to these Examples. In Examples, "parts" are by weight.

Synthetic Example 1

(Synthesis of the sensitizer A)

In a 300 ml three-necked flask, 6.00 g of the below compound (I) obtained in Example 1 in Japanese Patent Kokai Publication No. 139375/1980, 10.75 g of naphthoquinone-(1,2)-diazide-(2)-5-sulfonyl chloride (in the molar ratio of 1:2) and 168 g of dioxane were charged and stirred to achieve complete dissolution. 4.45 Grams of triethylamine was dropwise added over 30 minutes while stirring on a water bath to keep the reaction temperature at 20°-25° C. Reaction was carried out with stirring for further 4 hours at 20°-25° C. The reaction solution was then charged into ion-exchanged water, filtered and dried to obtain a sensitizer, which is referred to as sensitizer A.

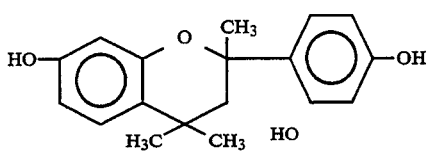 (I)

Synthetic Example 2–6

(Synthesis of the sensitizer B, C, D, E and F)

The same procedures as in Synthetic Example 1 were repeated, except that the compound of the following formula (II) (for the sensitizer B), formula (III) (for the sensitizer C), formula (IV) (for the sensitizer D), formula (V) (for the sensitizer E) or 2,3,4-trihydroxybenzophenone (for the sensitizer F) (in the molar ratio of 1:2) was used instead of the compound (I) to obtain a sensitizer, which is referred to as sensitizer B, C, D, E or F.

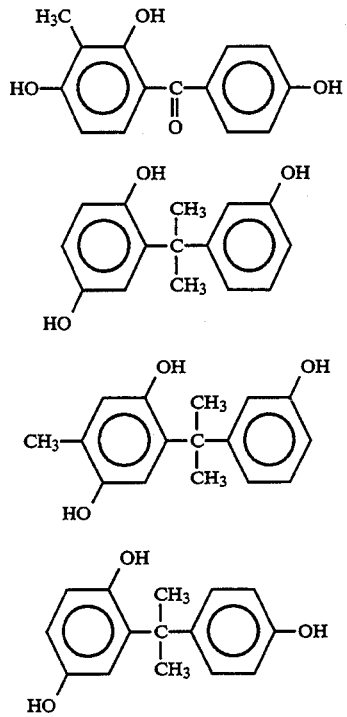

Synthetic Example 7

(Synthesis of the sensitizer G)

In a 300 ml three-necked flask, 4.60 g of 2,3,4-trihydroxybenzophenone, 10.75 g of naphthoquinone-(1,2)-diazide-(2)-5-sulfonyl chloride (in the molar ratio of 1:2) and 155 g of chloroform were charged and stirred to achieve complete dissolution. 4.45 Grams of triethylamine was dropwise added over 30 minutes while stirring on a water bath to keep the reaction temperature at 20°–25° C. Reaction was carried out with stirring for further 4 hours at 20°–25° C. The reaction solution was then charged into ion-exchanged water, filtered and dried to obtain a sensitizer, which is referred to as sensitizer G.

Synthetic Example 8

(Synthesis of the sensitizer H)

The same procedures as in Synthetic Example 7 were repeated, except that the compound of the formula (II) was used instead of 2,3,4-trihydroxybenzophenone to obtain a sensitizer, which is referred to as sensitizer H.

Synthetic Example 9–10

(Synthesis of the sensitizer I and J)

The same procedures as in Synthetic Example 7 were repeated, except that the compound (I) (for the sensitizer I) or 2,3,4,4'-tetrahydroxybenzophenone (for the sensitizer J) (on molar ratio of 1:3) was used instead of 2,3,4-trihydroxybenzophenone to obtain a sensitizer, which is referred to as sensitizer I or J.

Synthetic Example 11

(Synthesis of the sensitizer K)

The same procedures as in Synthetic Example 1 were repeated, except that the compound of the below described formula (VI) (in molar ratio of 1:4) was used instead of the compound (I), to obtain a sensitizer, which is referred to as sensitizer K.

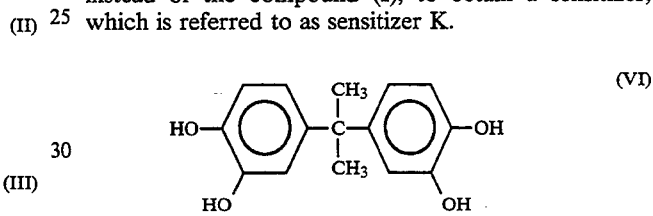 (VI)

Examples 1–9 and Comparative Examples 1–4

The sensitizer A through K obtained in Synthetic Examples 1–11 and a novolak resin in amounts shown in Table 1 were dissolved in 48 parts of ethyl cellosolve acetate to prepare a resist solution, which was filtered through a Teflon (trade mark) filter of 0.2 μm in pore size. The resist solution was coated on a silicon wafer, which had been rinsed in a usual manner, by means of a spinner so as to form a resist film of 1.3 μm in thickness. Subsequently, the silicon wafer was baked for 60 seconds on a hot plate kept at 100° C., and exposed to light while varying the exposure value stepwise by means of a reduction projection exposing apparatus (DSW 4800 with NA=0.28 manufactured by GCA) in having a wavelength of 436 nm. Thereafter, the silicon wafer was developed for 1 minute in a developing solution (SOPD manufactured by Sumitomo Chemical Company, Limited) to obtain a positive pattern. The γ-value is expressed in terms of tan θ the angle θ of which is obtained by plotting the rate of the standardized film thickness (=the retained film thickness/the original film thickness) against the exposure value and calculating the inclination of the plotted line. The γ-value and the resolution which was obtained at the same time are shown in Table.

For the HPLC analysis, a chromatographic apparatus (LC-4A manufactured by Shimadzu Manufacturing, Limited) was used. As a column, Ricrosolve RP-10 (10 μm) (4 mmΦ×250 mm column manufactured by Sumika Chemical Analysis Service, Ltd.) and, as a carrier solvent, a mixture of 57.5% of water, 36.1% of THF, 6.4% of methanol and 1% of formic acid were used. The flow rate of the carrier solvent was 1.0 ml/min.

A chromatographic analysis was carried out by using the primary detector with the UV light having the wavelength of 254 nm.

To identify the peaks corresponding to the diester component and the complete ester component, mass spectroscopic analysis was carried out by a secondary ion mass spectrum (SIMS) after separation by HPLC.

TABLE

| Example No. | Resist component | | HPLC Area Ratio (%) | | γ-value | Film thickness retention (%) |
|---|---|---|---|---|---|---|
| | Novolak resin*1) (parts) | Sensitizer (parts) | Diester Component | Complete Ester component | | |
| 1 | 17 | A,4 | K,1 | 75 | 11 | 3.8 | 99 |
| 2 | 17 | B,5 | — | 66 | 22 | 3.6 | 99 |
| 3 | 17 | C,4 | K,1 | 77 | 12 | 3.9 | 99 |
| 4 | 17 | C,4 | I,1 | 79 | 10 | 3.8 | 99 |
| 5 | 17 | D,4 | K,1 | 72 | 12 | 3.9 | 99 |
| 6 | 17 | E,4 | K,1 | 70 | 13 | 4.0 | 99 |
| 7 | 17 | E,4 | I,1 | 72 | 14 | 4.0 | 99 |
| 8 | 17 | G,5 | — | 56 | 39 | 2.8 | 98 |
| 9 | 17 | H,5 | — | 84 | 8 | 4.2 | 98 |
| Comp. 1 | 17 | F,5 | — | 33 | 59 | 2.3 | 99 |
| Comp. 2 | 17 | J,5 | — | 12 | 55 | 2.1 | 99 |
| Comp. 3 | 17 | A,5 | — | 93 | 0 | 4.0 | 95 |
| Comp. 4 | 17 | C,5 | — | 95 | 2 | 4.1 | 96 |

Note: *1) Novolak Resin
A cresol mixture (the molecular ration of m-isomer to p-isomer, 7/3) was reacted with formalin (the molar ratio of formalin to cresol, 1/0.8) using oxalic acid as a catalyst under reflux to obtain a movolak resin of 9800 in weight average molecular weight calculated as polystyrene.

What is claimed is:

1. A positive resist composition which comprises in admixture an alkali-soluble resin and, as a sensitizer, first and second quinone diazide sulfonic acid esters of a phenol compound, wherein
    (a) said first ester is a quinone diazide sulfonic acid diester of a phenol compound having not less than three hydroxyl groups which exhibits a pattern area that is not less than 40% of all pattern areas corresponding to the sensitizer in a high pressure liquid chromatography (HPLC) pattern measured with a primary detector using UV light having a wavelength of 254 nm, and
    (b) said second ester is a quinone diazide sulfonic acid ester that is a complete ester of a phenol compound having not less than two hydroxyl groups prepared by reacting the quinone diazide sulfonyl halogenide with a di- or polyhydric phenol compound of the formula

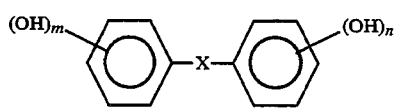

wherein X is a group of the formula:

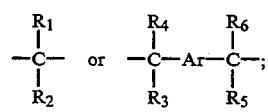

in which $R_1$, $R_2$, $R_3$, $R_4$, $R_5$ and $R_6$ are the same or different and each a hydrogen atom, an alkyl group, an aryl group, an alkenyl group or cyclohexyl group and Ar is a divalent aromatic group; m and n are the same or different and each zero or a positive number, provided that the sum of m and n is not less than 2, which exhibits a pattern area corresponding to not less than 5% and is less than 60% of all pattern areas corresponding to the sensitizer in the HPLC pattern.

2. The positive resist composition according to claim 1, wherein the pattern area corresponding to the quinone diazide sulfonic acid diester of the phenol compound having not less than three hydroxyl groups is not less than 50% of all the pattern areas corresponding to the sensitizer in the HPLC pattern.

3. The positive resist composition according to claim 1, wherein an amount of the quinone diazide sulfonic acid ester of the phenol compound is from 10 to 50% by weight based on the total weight of the solid components in the resist composition.

4. The positive resist composition according to claim 1, wherein the quinone diazide sulfonic acid diester is prepared using the phenol compound

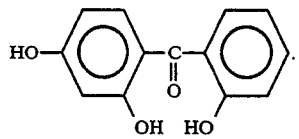

5. The positive resist composition according to claim 1, wherein the quinone diazide sulfonic acid diester is prepared using the phenol compound

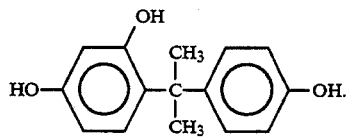

6. The positive resist composition according to claim 1, wherein the quinone diazide sulfonic acid diester is prepared using the phenol compound

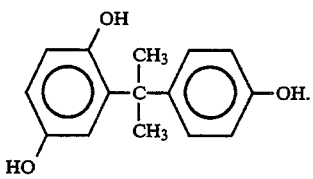

7. The positive resist composition according to claim 1, wherein the quinone diazide sulfonic acid diester is prepared using the phenol compound

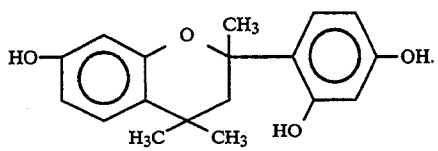

8. The positive resist composition according to claim 1, wherein the quinone diazide sulfonic acid diester is prepared using the phenol compound

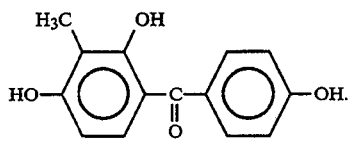

9. The positive resist composition according to claim 1, wherein the quinone diazide sulfonic acid diester is prepared using the phenol compound

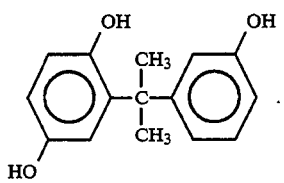

10. The positive resist composition according to claim 1, wherein the quinone diazide sulfonic acid diester is prepared using the phenol compound

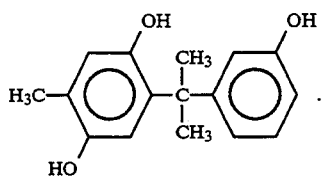

11. The positive resist composition according to claim 1, wherein the quinone diazide sulfonic acid diester is prepared from a condensation reaction wherein chloroform is used as a solvent.

12. The positive resist composition according to claim 1, wherein the quinone diazide sulfonic acid diester is prepared from a condensation reaction wherein trichloroethane, trichloroethylene or dichloroethane is used as a solvent.

13. The positive resist composition according to claim 1, wherein the alkali-soluble resin is a novolak resin.

14. A positive resist composition according to claim 1, wherein the phenol compound having not less than three hydroxyl groups is selected from the group consisting of

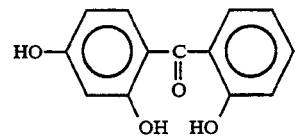

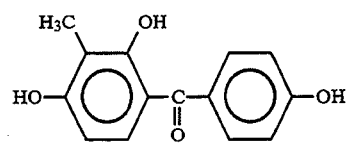

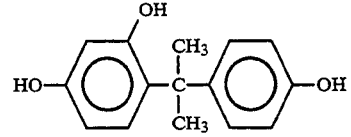

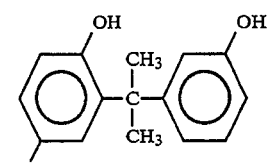

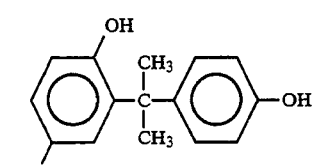

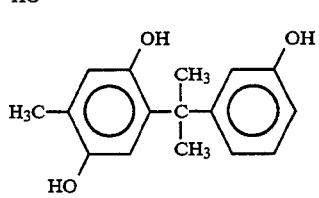

and

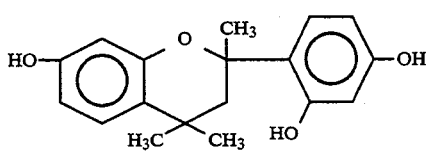

* * * * *